United States Patent
Huisman et al.

(10) Patent No.: US 10,317,808 B2
(45) Date of Patent: Jun. 11, 2019

(54) POSITION SENSING ARRANGEMENT AND LITHOGRAPHIC APPARATUS INCLUDING SUCH AN ARRANGEMENT, POSITION SENSING METHOD AND DEVICE MANUFACTURING METHOD

(71) Applicant: ASML NETHERLANDS B.V., Veldhoven (NL)

(72) Inventors: Simon Reinald Huisman, Eindhoven (NL); Alessandro Polo, Arendonk (BE); Duygu Akbulut, Eindhoven (NL); Sebastianus Adrianus Goorden, Eindhoven (NL); Arie Jeffrey Den Boef, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/069,678

(22) PCT Filed: Jan. 16, 2017

(86) PCT No.: PCT/EP2017/050806
§ 371 (c)(1),
(2) Date: Jul. 12, 2018

(87) PCT Pub. No.: WO2017/125352
PCT Pub. Date: Jul. 27, 2017

(65) Prior Publication Data
US 2019/0049866 A1 Feb. 14, 2019

(30) Foreign Application Priority Data
Jan. 19, 2016 (EP) .................................... 16151931

(51) Int. Cl.
*G01B 11/00* (2006.01)
*G03F 9/00* (2006.01)
(Continued)

(52) U.S. Cl.
CPC .......... *G03F 9/7049* (2013.01); *G01B 9/0201* (2013.01); *G01B 9/02003* (2013.01); *G01B 9/02097* (2013.01); *G01D 5/266* (2013.01)

(58) Field of Classification Search
CPC .......... G01B 11/27; G01B 11/272; G03F 9/70; G03F 7/70358; H01L 21/681
(Continued)

(56) References Cited

U.S. PATENT DOCUMENTS 6,285,455 B1   9/2001   Shiraishi
6,297,876 B1  10/2001   Bornebroek
(Continued)

FOREIGN PATENT DOCUMENTS

EP   2120097 A1      11/2009
WO   2015120070 A1    8/2015

OTHER PUBLICATIONS

Continuous-variable optical quantum-state tomography, A. I. Lvovsky et al., Reviews of Modern Physics, vol. 81, Jan.-Mar. 2009, 299-332.
(Continued)

*Primary Examiner* — Md M Rahman
(74) *Attorney, Agent, or Firm* — Arent Fox LLP

(57) ABSTRACT

In an alignment sensor of a lithographic apparatus, position sensing radiation is delivered to a target (P1). After reflection or diffraction from the target, position sensing radiation is processed to determine a position of the target. Reference radiation interferes with the position sensing radiation) while a relative phase modulation is applied between the reference radiation and the position sensing radiation. The interfering radiation includes a time-varying component defined by the applied phase modulation. The interfering radiation is delivered to two photodetectors in such a way that each photodetector receives said time-varying compo-
(Continued)

nent in anti-phase to that received at the other photodetector. A difference signal (i(t)) from said photodetectors contains an amplified, low noise version of said time-varying component. This is used in determining the position of the target. Mode matching enhances interference. Surface scattered radiation is rejected.

18 Claims, 9 Drawing Sheets

(51) Int. Cl.
  *G01B 9/02* (2006.01)
  *G01D 5/26* (2006.01)
(58) Field of Classification Search
  USPC ........................................................ 356/399
  See application file for complete search history.

(56) References Cited

U.S. PATENT DOCUMENTS

| | | |
|---|---|---|
| 6,631,004 B1 | 10/2003 | Hill et al. |
| 2004/0033426 A1 | 2/2004 | Den Boef et al. |
| 2005/0213103 A1 | 9/2005 | Everett et al. |
| 2009/0195768 A1 | 8/2009 | Bijnen et al. |
| 2013/0278914 A1 | 10/2013 | Demarest |
| 2015/0261097 A1 | 9/2015 | Mathijssen et al. |

OTHER PUBLICATIONS

Instant single-photon Fock state tomography, S. R. Huisman et al., Sep. 15, 2009 / vol. 34, No. 18 / Optics Letters 2739.
New Alignment Sensors for Wafer Stepper, Kazuya Ota et al., 304 / SPIE vol. 1463 Optical/Laser Microlithography IV (1991).
U Leonhardt, Measuring the quantum state of light, Cambridge University Press (1997) pp. 83-89.

(a)           (b)

POSITION SENSING ARRANGEMENT AND LITHOGRAPHIC APPARATUS INCLUDING SUCH AN ARRANGEMENT, POSITION SENSING METHOD AND DEVICE MANUFACTURING METHOD

CROSS-REFERENCE TO RELATED APPLICATIONS

This application is the U.S. National Stage Application of International Patent Application No. PCT/EP2017/050806, filed on Jan. 16, 2017 which claims priority of EP application 16151931.9 which was filed on Jan. 19, 2016 both of which are incorporated herein in their entirety by reference.

FIELD

The present invention relates to position sensing arrangements based on optical systems. The invention may be applied for example in inspection apparatus and lithographic apparatuses usable, for example, in the manufacture of devices by lithographic techniques.

BACKGROUND

A lithographic process is one that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. Stepping and/or scanning movements can be involved, to repeat the pattern at successive target portions across the substrate. It is also possible to transfer the pattern from the patterning device to the substrate by imprinting the pattern onto the substrate.

In lithographic processes, it is necessary to make very accurate position measurements over a substrate, to ensure proper alignment between patterns formed in different patterning steps, for example between two layers in a device. Accurate position sensors have been developed which use optical phenomena such as diffraction and interference to obtain position information from alignment marks formed on the substrate. One type of position sensor is based on a self-referencing interferometer, described for example in US2004033426A1. Various enhancements and modifications of the position sensor have been developed, for example as disclosed in US2015261097A1. Modified alignment marks have also been developed, for example as disclosed in US2009195768A1, The contents of these publications are incorporated herein by reference. The present disclosure is not limited to this specific type of interferometer.

In many applications, optical properties of the substrate and alignment marks make it difficult to obtain a high-quality signal. For example, as the manufacturing process progresses, it may be necessary to read an alignment mark which is buried under various layers of material. Photocurrents obtained by photodetectors within the optical system of the position sensing arrangement become very weak, and difficult to distinguish from electronic noise. The sensors which are employed in state-of-the-art lithographic apparatuses use several techniques to obtain the best quality signal, for example by selecting from a range of different wavelengths and polarizations of radiation, to find the one which best penetrates layers overlying the alignment mark. Nevertheless, requirements for accuracy are ever-increasing, while the structures to be measured become more complex. One way to improve signal quality is by taking more time for the measurement. However, this may be undesirable because of the requirement to maintain a very high throughput in a commercial lithographic apparatus.

Other types of position sensors are known, and are also subject of the present disclosure. One example is the ATH-ENA sensor as disclosed in U.S. Pat. No. 6,297,876B1 (Bornebroek et al) and the laser interferometric alignment (LIA) sensor disclosed in U.S. Pat. No. 6,285,455B1 (Shiraishi).

In an unrelated field, that of quantum optics, a technique of balanced heterodyne detection has been developed to allow very sensitive detection of single photon events with high detection bandwidths. These techniques are described for example in the publications U Leonhardt, Measuring the quantum state of light, Cambridge University Press (1997); S RHuisman, et al, Opt. Lett., 34, p 2739 (2009); and A I Lvovsky and M G Raymer, Rev. Mod. Phys., 81, p 299 (2009). The contents of these publications are incorporated herein by reference. Note that "bandwidth" in this context relates to the bandwidth of signals being processed, not the bandwidth of the radiation used to obtain those signals.

SUMMARY

The inventors have recognized that improved accuracy in a position sensing arrangement can be obtained by applying a balanced heterodyne detection technique.

The invention in a first aspect provides a position sensing arrangement comprising:
an illumination optical system for delivering position sensing radiation to a target;
a collection optical system for collecting said position sensing radiation after reflection from the target; and
a position signal processing system for receiving the collected position sensing radiation and for processing the collected position sensing radiation to determine a position of the target;
wherein said position signal processing system further comprises a reference beam delivery system for causing reference radiation to interfere with the collected position sensing radiation, thereby providing interfering radiation,
wherein a relative phase modulation is applied between the reference radiation and the position sensing radiation so that the interfering radiation includes a time-varying component defined by the applied phase modulation,
wherein the position signal processing system includes (i) an optical signal splitting arrangement configured to deliver the interfering radiation to two photodetectors in such a way that each photodetector receives a portion of said interfering radiation, each portion having said time-varying component in anti-phase to the portion received at the other photodetector, and (ii) a detector arranged to receive a difference signal from said two photodetectors and to extract a time-varying component of said difference signal by reference to said applied phase modulation.

The invention can be applied by modification of existing position sensing arrangements, without changing the physical principles of the position sensing arrangement. What changes is the reference beam delivery and the manner of detecting optical signals within the position sensing arrangement.

While two photodetectors are specifically mentioned as part of the invention, it is not intended to exclude embodiments having additional photodetectors. These may be provided, singly or in pairs, as part of the position sensing arrangement. These additional detectors can provide signals that are used in combination with the signals from the mentioned two photodetectors, to provide a final position measurement. Such variations do not deviate from the principle of invention as set forth above and as explained below.

As an example of applied phase modulation, linear phase variation can be applied. A linearly increasing or decreasing phase shift results in a constant relative frequency shift between the position sensing radiation and the reference radiation. This frequency shift results in a time varying component in the interfering radiation with a characteristic frequency corresponding to the relative frequency shift. Using a device that selects a specific spectral component, such as, for example, a lock-in amplifier or a spectrum analyzer, the desired position signal can be separated with high quality from other signals and from noise in the optical and electronic systems.

In an embodiment said two photodetectors are connected in series so as to generate said difference signal prior to any amplification or conversion.

In an embodiment said position signal processing system includes a self-referencing interferometer. In an embodiment said reference beam delivery system includes a mode matching device for matching diffraction signals in the reference radiation with diffraction signals of a particular target. In an embodiment said mode matching device includes a reference structure having a form matching that of the target. In an embodiment said mode matching device includes a plurality of reference structures, selectable to match different targets. In an embodiment said collection optical system includes an objective lens and said mode matching device further includes an objective lens matching the objective lens of the collection optical system.

In an embodiment said position signal processing system includes a reference element arranged to receive off-axis diffraction signals that have been generated by the target and recombine the off-axis diffraction signals into an on-axis optical position signal.

In an embodiment said illumination system includes a reference element arranged to generate off-axis diffraction signals that are then recombined by the target into an on-axis position signal.

In an embodiment wherein said reference beam delivery system is configured to cause interference with collected radiation only of certain diffracted angles, thereby avoiding interference with a radiation scattered by the target surface at other angles.

In an embodiment said position signal processing system is arranged to determine said position using said position sensing radiation collected at multiple positions of the collection optical system relative to the target. In an embodiment said position signal processing system is arranged to determine said position using said position sensing radiation collected during a scanning movement of the collection optical system relative to the target.

In an embodiment the position sensing radiation and the reference radiation include radiation derived from one or more coherent radiation sources.

In a particular embodiment, the position sensing radiation comprises first position sensing radiation having a first wavelength range and second position sensing radiation having a second wavelength range, the reference radiation comprises first reference radiation having substantially the first wavelength range and second reference radiation having substantially the second wavelength range, the first reference radiation and first position sensing radiation are provided with a first applied phase modulation and the second reference radiation and second position sensing radiation are provided with a second applied phase modulation so that the interfering radiation detected in the position signal processing system includes a first time-varying component corresponding to the first applied phase modulation and a second time-varying component corresponding to the second applied phase modulation, and the position signal processing system comprises one or more detectors operable with reference to both the first and second applied phase modulations and is operable to select which of the first and/or second position sensing radiation is used to determine said position.

In an embodiment the reference beam delivery system includes one or more adjustable attenuators for adjustably reducing intensity of the reference radiation.

In an embodiment the or each applied phase modulation results in a relative frequency shift between the position sensing radiation and the reference radiation, said time varying component in the interfering radiation comprising a characteristic frequency corresponding to the relative frequency shift.

The invention further provides a lithographic apparatus wherein an alignment sensor includes a position sensing arrangement as claimed in any preceding claim, the lithographic apparatus further comprising a mechanism for controlling the applying of a pattern to a substrate in response to position measurements made using the position sensing system on targets provided across the substrate.

The invention further provides a method position sensing method comprising:
(a) delivering position sensing radiation to a target;
(b) collecting said position sensing radiation after reflection or diffraction from the target; and
(c) processing the collected position sensing radiation to determine a position of the target, wherein the step (c) includes the steps:
(c1) causing reference radiation to interfere with the collected position sensing radiation while applying a relative phase modulation between the reference radiation and the position sensing radiation, so that the interfering radiation includes a time-varying component defined by the applied phase modulation;
(c2) delivering the interfering radiation to two photodetectors in such a way that each photodetector receives a portion of said interfering radiation, each having said time-varying component in anti-phase to the portion received at the other photodetector; and
(c3) receiving a difference signal from said two photodetectors and extracting a time-varying component of said difference signal by reference to said applied phase modulation, the extracted time varying component being used in determining the position of the target.

In an embodiment of the method according to the invention said two photodetectors are connected in series so as to generate said difference signal prior to any amplification or conversion.

In an embodiment of the method according to the invention the collected position sensing radiation is processed using a self-referencing interferometer. In a further embodiment reference radiation is delivered in such a way that diffraction signals in the reference radiation are matched with diffraction signals of a particular target. In an embodiment said reference radiation is delivered via a reference structure having a form matching that of the target. In an embodiment the method further includes as a preliminary step selecting said reference structure from a plurality of reference structures which have different forms to match different targets.

In an embodiment said diffracted radiation is collected via a first objective lens and said reference radiation is delivered via a matching second objective lens.

In an embodiment a reference element is arranged to receive off-axis diffraction signals that have been generated by the target and to recombine the off-axis diffraction signals into an on-axis optical position signal.

In an embodiment a reference element is arranged to generate off-axis diffraction signals in said position sensing radiation prior to interaction with the target, the off-axis diffraction signals then being recombined by the target into an on-axis position signal.

In an embodiment said reference radiation is arranged to interfere with collected radiation only of certain diffracted angles, thereby avoiding interference with a radiation scattered by the target surface at other angles.

In an embodiment said position sensing radiation is collected at multiple positions of the collection optical system relative to the target. In an embodiment said position is determined using said position sensing radiation collected during a scanning movement of the collection optical system relative to the target.

In an embodiment the position sensing radiation and the reference radiation include radiation derived from one or more coherent radiation sources.

In an embodiment the position sensing radiation comprises first position sensing radiation having a first wavelength range and second position sensing radiation having a second wavelength range, wherein the reference radiation comprises first reference radiation having substantially the first wavelength range and second reference radiation having substantially the second wavelength range, wherein the first reference radiation and first position sensing radiation are provided with a first applied phase modulation and the second reference radiation and second position sensing radiation are provided with a second applied phase modulation so that the interfering radiation includes a first time-varying component corresponding to the first applied phase modulation and a second time-varying component corresponding to the second applied phase modulation, and wherein the step (c3) is performed with reference to either or both of the first and second applied phase modulations to select which of the first and/or second position sensing radiation is used to determine said position.

In an embodiment the method further comprises adjusting intensity of the reference radiation to adjust optical amplification of an optical position sensing signal. In an embodiment the or each applied phase modulation results in a relative frequency shift between the position sensing radiation and the reference radiation, said time varying component in the interfering radiation comprising a characteristic frequency corresponding to the relative frequency shift.

The invention yet further provides a device manufacturing method in which a position sensing method according to the invention as set forth above is used to apply patterns to a substrate in response to using the position measurements.

These and further features and advantages of the invention will be apparent to the skilled reader from a consideration of the detailed description of examples that follows.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Figure 1:
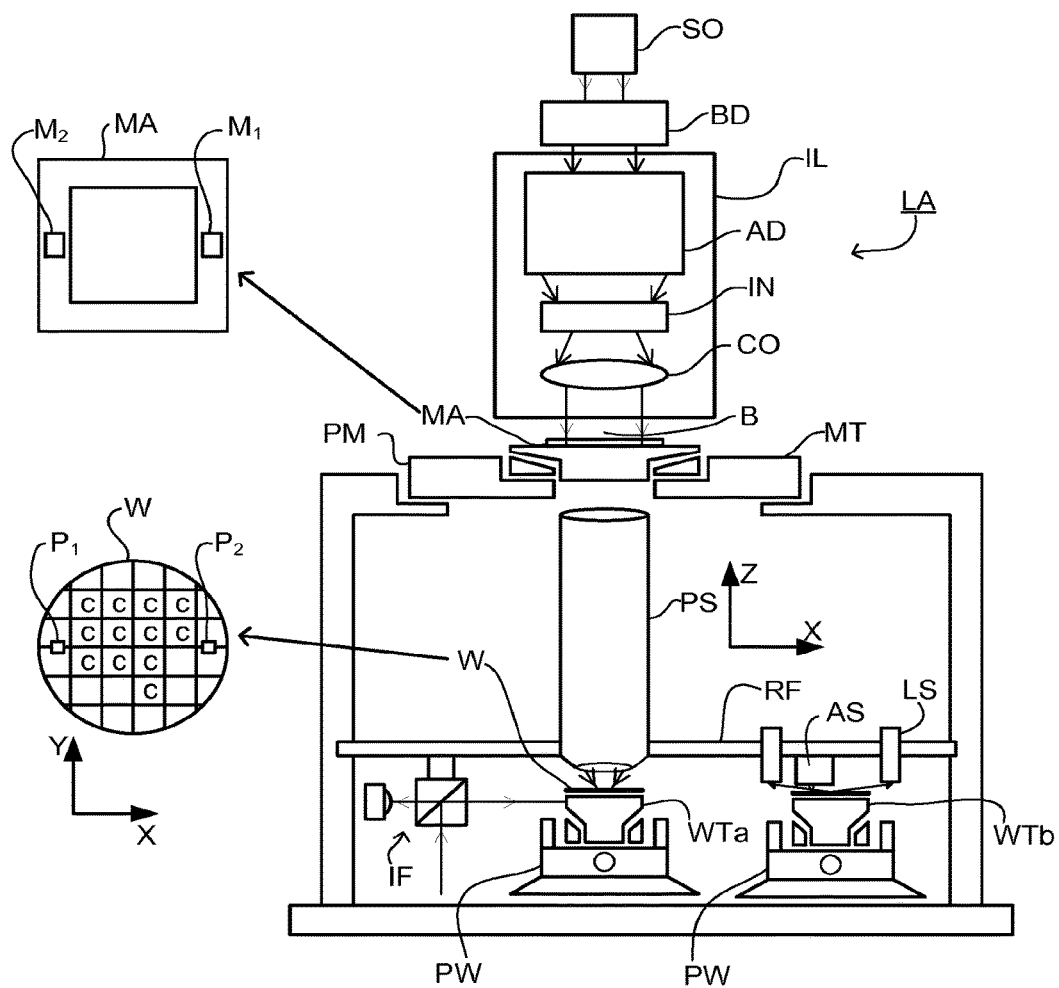
FIG. 1 depicts a lithographic apparatus in which the invention may be applied as an alignment sensor.

FIG. 1 schematically depicts a lithographic apparatus. The apparatus comprises:

- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

For introducing the concepts of the present disclosure, it will be assumed for the moment that the alignment sensor AS is generally of the form described in U.S. Pat. No. 6,961,116, mentioned in the introduction. Each alignment mark (P1, P2 in the example of FIG. 1) comprises a series of bars formed in a product layer or other layer applied to or etched into the substrate. The bars are regularly spaced and act as grating lines so that the mark can be regarded as a diffraction grating with a well-known spatial period (pitch). Depending on the orientation of these grating lines, a mark may be designed to allow measurement of position in the X direction, or in the Y direction. Another known type of mark has bars arranged at 45 degrees with respect to both the X- and Y-axes. A combined X- and Y-measurement can be performed using the techniques described in the published patent application US2009195768A. Examples based on other types of alignment sensors will be described further below.

Figure 2:
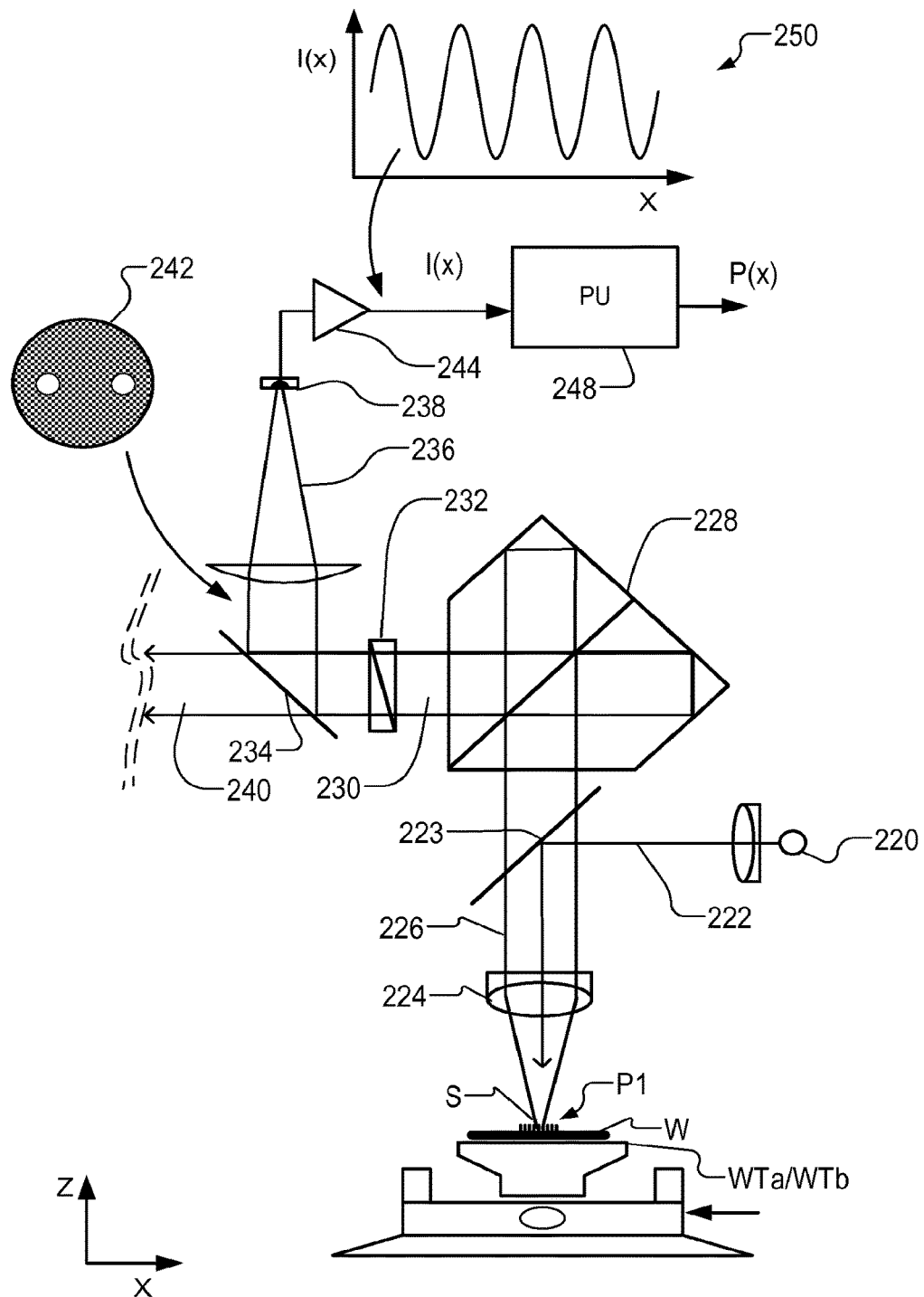
FIG. 2 illustrates schematically the form and operating principle of a position sensing arrangement in a known lithographic apparatus.

FIG. 2 is a schematic block diagram of the known alignment sensor AS, which can be adapted to form one an embodiment of the present disclosure. Illumination source 220 provides a beam 222 of radiation of one of more wavelengths, which is diverted by a spot mirror 223 through an objective lens 224 onto a mark, such as mark P1, located on substrate W.

Radiation scattered, i.e. diffracted, by mark P1 is picked up by objective lens 224 and collimated into information-carrying beams 226. A radiation processing element, in this embodiment a self-referencing interferometer 228 of the type disclosed in US'116, mentioned above, interferes the beam 226 with itself. An interference beam 230 is delivered via a half wave plate 232 to a polarizing beam splitter 234. Polarizing beam splitter 234 delivers a first optical position signal 236 onto a photodetector 238. The photodetector may be a single element, or it may comprise a number of pixels, if desired. A second optical position signal 240 can be delivered similarly to a second photodetector (not shown), which allows normalization of signal intensities in a known manner.

The skilled reader will appreciate that additional components can be included in a practical embodiments, that do not need to be described here in detail. For example, a Babinet-Soleil phase compensator may be applied in advance of half wave plate 232.

Spot mirror 223 not only serves to divert radiation from the illumination source into the objective lens, but also serves to block zero order radiation reflected by the mark, thereby causing the information carrying beam 226 to comprise only higher order signals of the radiation diffracted by the mark 202. Consequently, as illustrated at 242, a profile of the first optical position signal 236 before it is focused on to detector 238 may comprise two first order diffraction spots at opposite positions in the pupil. When these diffraction spots are combined to interfere at the detector 238, an optical signal is obtained which varies periodically, in accordance with the position relative to the grating. An amplifier 244 amplifies intensity signals from photodetector 238, and supplies them to processing unit 248.

A graph 250 illustrates schematically the relationship between the intensity signal I(x) obtained from photodetector 238 as a function of position X, relative to an X-direction alignment mark. When the spot S is placed at different positions relative to the alignment mark, for example by executing a linear scanning movement, this periodic curve is traced out in the intensity signal. By a combination of the optical processing in the self-referencing interferometer 228 and the computational processing in the processing unit 248, values P for X- and Y-position on the substrate relative to the reference frame RF are output. Marks with different periodicities are scanned to obtain unambiguous position measurement. Processing unit 248 may be separate from the control unit LACU shown in FIG. 1, or they may share the same processing hardware. This is a matter of design choice and convenience. Where processing unit 248 is separate, part of the signal processing may be performed in the processing unit 248 and another part in unit LACU.

As mentioned in the introduction, in some cases the optical signals can be weak, causing the amplified photocurrent to be dominated by various noise sources, such as the intrinsic shot-noise of the radiation and electronic noise of the detectors. Consequently, accuracy of position measurements reduces. Disclosed herein is a modified position sensing arrangement, in which balanced heterodyne detection principles are applied to obtain a stronger radiation signal. Therefore the detected photocurrent becomes stronger and its noise becomes limited only by shot-noise, which leads to a better signal to noise ratio, improving the accuracy of the position measurements. Desirable attributes that can be met with the techniques to be disclosed herein include high-speed, accurate position measurement, even on low quality alignment marks. Furthermore, detection sensitivity can be adjusted by intensity control of a reference beam. The techniques also facilitate spectrally resolved detection, that is to say simultaneous or sequential measurements made using different wavelengths of radiation.

Figure 3:
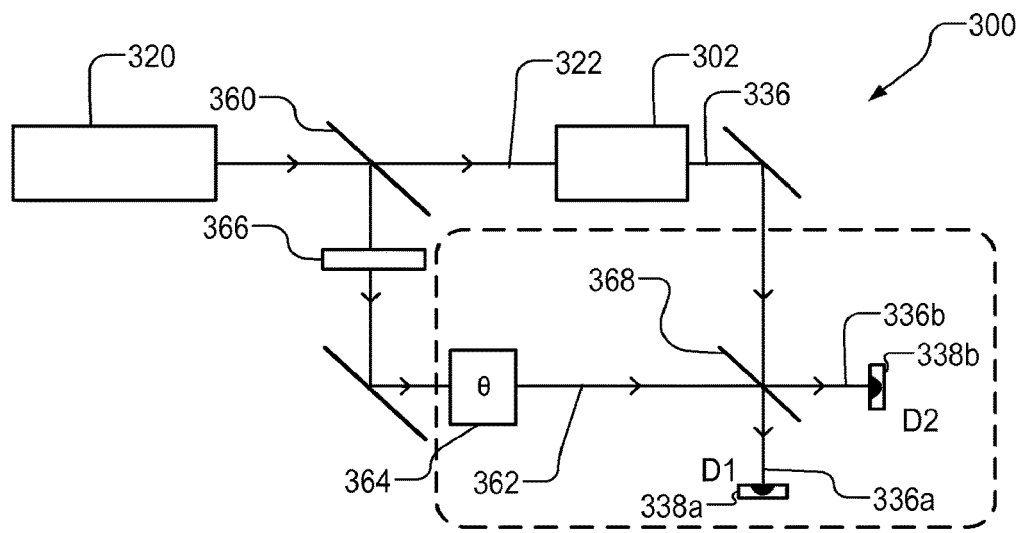
FIG. 3 illustrates schematically optical signal processing in a modified position sensing arrangement, in which balanced heterodyne detection is applied in accordance with one embodiment of the present invention.

FIG. 3 illustrates schematically the modification to apply balanced heterodyne detection in a position sensing arrangement of the type illustrated in FIG. 2. Arrangement 300 is a modified optical system based around a position sensing optical system 302. Optical system 302 includes spot mirror, objective lens, self-referencing interferometer, half wave plate and beam splitter arrangements, similar to those shown in FIG. 2. A radiation source 320 provides position sensing radiation 322 for the position sensing arrangement. To implement the balanced heterodyne detection technique, a portion of this radiation is taken by a beam splitter 360 to provide reference radiation 362. A phase modulator 364 applies a phase modulation to the reference radiation 362, relative to the position sensing radiation 322. An attenuating device 366 provides for control of the intensity of the reference radiation. Position signal 336 in the modified arrangement is not focused on a single photodetector, but is mixed with the reference radiation 362 in a beam splitter 368.

Because of the applied relative phase modulation, interference between the reference radiation and the position signal radiation results in a pair of optical position signals, labeled 336a and 336b in FIG. 3. Each of these optical position signals carries a time varying component corresponding to time variations in the phase θ applied by phase modulator 364. The time varying components in the two optical position signals 336a and 336b are exactly in antiphase with one another. The optical position signals are focused onto a matched pair of photodetectors 338a and 338b. By subtracting the signals from the two photodetectors, the time varying component becomes highlighted. Using synchronous detection based on knowledge of the applied phase modulation, the optical position signals can be used to obtain an electronic position signal with improved signal to noise ratio.

Figure 4:
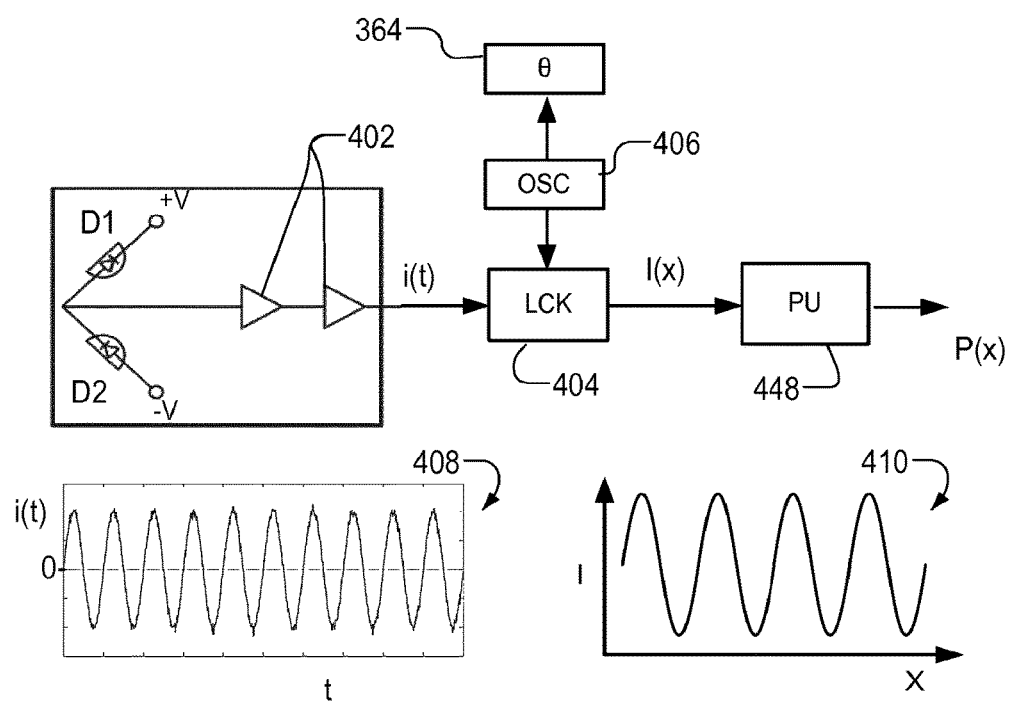
FIG. 4 illustrates electronic signal processing in the modified position sensing arrangement of FIG. 3.

Referring now to FIG. 4, a block schematic diagram of the electronic (analog and/or digital) signal processing is shown. Photodiodes D1 and D2 correspond to the photodetectors 338a and 338b in the optical system diagram of FIG. 3. In this example, the photodiodes D1 and D2 are connected directly in series across a power supply. An analog current signal flows out of the node where the two photodiodes are connected, corresponding to the difference in photocurrents of the two photodiodes, and therefore the difference in radiation intensities seen by the two photodiodes. Matched photodiodes are chosen, which will be as near as possible identical in their response to radiation. This arrangement cancels out common mode signals, whose intensity is the same on both photodetectors, and isolates only the difference between the intensities of the two optical position signals 336a and 336b.

One or more low-noise preamplifiers 402 supply an amplified difference current signal i(t) to a detection circuit 404. Detection circuit 404 is selective for the time-varying components that correspond with applied phase modulation. For example, the phase modulation may comprise a constant increase or decrease of relative phase, equivalent in effect to a frequency shift between the position sensing radiation 322 and the reference radiation. A reference oscillator 406 generates a reference signal having the frequency of the desired frequency shift, and supplies it to the detection circuit 404 as well as to the phase modulator 364. As illustrated by graph 408, the result of the phase modulation is a time varying signal i(t) with a frequency component corresponding exactly to the reference frequency provided by oscillator 406.

Detection circuit 404 delivers a position-sensitive signal I(x) based on the amplitude of the frequency component detected by detection circuit 404 over a range of positions. Assuming that the characteristic frequency of the applied phase modulation is much higher than the bandwidth needed for position measurement, this signal is directly related to the position signal I(x) in the prior arrangement of FIG. 2, but has far greater noise immunity. Like for the prior arrangement, when the spot S is scanned at speed over the alignment mark, this signal will carry dominant frequency components related to the mark's grating structure. These frequency components can be analyzed with processing unit 448 in substantially the same way as the processing unit 248 used in the known position sensing arrangement, but delivering more accurate results. The characteristic frequency of the applied phase modulation may be, for example, tens of kilohertz, hundreds of kilohertz, megahertz or even several hundreds of megahertz. The position sensing bandwidth (i.e. the number of position signal samples per second) will be limited to some fraction of this characteristic frequency, determined by low-pass filter characteristics of the lock-in detector.

Detection circuit 404 in the present example is a lock-in detector (also known as a lock-in amplifier). Lock-in detection is known generally as a technique that can perform narrowband detection of a specific frequency component of a signal. In this way, low noise detection of a desired signal can be achieved by 'tagging' the signal of interest with a periodic variation using the applied phase modulation. The signal of interest is tagged by modulating the signal at a chosen frequency $\omega_D$, for example. A lock-in detector is locked at the chosen frequency $\omega_D$ to record the signal of interest and to ignore other signals, or noise, exceeding the bandwidth of lock-in detection. When a relative frequency shift is applied between the position sensing radiation 322 and the reference radiation 362, a beat frequency arises when the beams interfere. The beat frequency, equal to the relative frequency shift, is used as the lock-in frequency for the lock-in detectors.

In mathematical terms, the generation of this signal with greater noise immunity can be represented as follows. The intensities of the optical position signals at the two photodiodes D1 and D2 give rise to individual photocurrents $I_{D1}$ and $I_{D2}$ that can be written in the form:

$$I_{D1} = \frac{1}{2}[|E_{sig}|^2 + |E_{ref}|^2 + 2|E_{sig}||E_{ref}|\cos(2\pi\theta)]$$

$$I_{D2} = \frac{1}{2}[|E_{sig}|^2 + |E_{ref}|^2 - 2|E_{sig}||E_{ref}|\cos(2\pi\theta)]$$

where $|E_{sig}|$ represents the amplitude of optical position sensing signal 336, $|E_{ref}|$ represents the amplitude of reference radiation 362 and θ represents the applied relative phase at a given instant. For this purpose, it is assumed that position sensing radiation and reference radiation remain coherent when they are recombined at the beam splitter 368.

When the two photodiodes currents are subtracted from one another (balanced detection), a difference current $I_-$ results. Using the above equations, the strength of this difference current can be shown to be:

$$I_- = 2c[|E_{sig}||E_{ref}|\cos(2\pi\theta)]$$

where c is a constant that describes the conversion of light to electrons. Notice from this equation that the intensity of this difference current varies according to the cosine of the applied phase difference. An applied frequency shift implies that the phase difference θ is increasing linearly over time (θ=ωt), giving the characteristic frequency variation illustrated in the graph 408. In principle, any arbitrary phase modulation could be applied, provided a suitable matching detection circuit 404 is available. For example, one could use non-linear phase variations to generate characteristic frequency chirps, instead of pure frequency shifts.

Referring again to signal I(x) in FIG. 4, the exact form of the signal output by the lock-in amplifier (detection circuit 404) may be an absolute value of a sine function, rather than having the offset sine form illustrated in graph 410. Depending on the analysis algorithms chosen, this signal can be processed directly, or it can be squared to obtain a signal having the same form I(x) as shown. Either way, the signal of interest has a frequency directly related to the pitch of the grating structure in the alignment mark, and the phase of the signal at this frequency carries the position information.

Also notice that the equation represents an optical amplification of the position sensing signal. The amplitude of the difference current depends on the product of the intensity of the position sensing signal itself, and the intensity of the reference radiation. Accordingly, the desired signal can be amplified simply by increasing the intensity of the reference radiation. Detection sensitivity can be controlled using the attenuating device 366. This allows an increase in the detection system dynamic range. For example, if the intensity level of the radiation diffracted by an alignment mark is high, the intensity level of the first reference beam can be decreased while still maintaining the high sensitivity of the detection system. If, on the other hand, the intensity level of the radiation reflected by an alignment mark falls below a threshold intensity level required by the detection system to operate, then the intensity level of the first reference beam can be increased by a required amount by activation of the attenuating device 366. Processing unit 248 can be connected to actuators (not shown) to control the attenuating device automatically as required.

The skilled person will understand that coherence between different beams of radiation derived from a common source depends on spatial coherence and temporal coherence of the source radiation. Temporal coherence can be expressed in terms of coherence time but is commonly expressed in terms of coherence length (these are related simply by the speed of light in whatever is the transmitting medium). Two beams will interfere if the path lengths that these have followed are the same within a coherence length of the source radiation. The phase relationship between the waves in the two paths will be fixed. A monochromatic laser is considered a coherent light source because it produces radiation having a coherence length much longer than any distances found in a practical optical system. However, even though broadband radiation will normally be considered to be incoherent light, it still has a (small) coherence length, related to its spectral bandwidth. Spatial coherence refers to coherence across a beam of radiation (across a wave front), rather than longitudinally. In order to obtain useful interference between two beams derived from a common source, the spatial shift at each point in the beam should be within a coherence area of a corresponding point in the other beam.

In the case where radiation source 320 is a coherence source such as a laser, satisfying these coherence requirements presents no difficulty. In fact, a degree of incoherence may be introduced deliberately, to eliminate unwanted "speckle" and interference with unwanted reflections within the optical system. Incoherent light sources (and additional components such as for example optical filters) could be used in the optical arrangement of FIG. 3, provided that the path length differences are made negligible (that is, shorter than the coherence length of the used radiation). This constraint may bring challenges in the design. On the other hand, it brings a wider choice of radiation source, and it avoids the need to manage "speckle" and interference with unwanted reflections which arises when using spatially coherent sources. Use of balanced detection by connecting the two photodetectors in series may also bring the benefit of eliminating these unwanted components of radiation.

The phase modulator 364 may be for example an electro-optic modulator, a fiber modulator, a magneto-optical modulator, a modulator based on Zeeman Effect and/or an acousto-optic modulator. For the sake of example, phase modulator 364 may be an acousto-optic modulator (AOMs). If the phase modulator is controlled to apply a linearly changing phase shift θ, it may be referred to as a frequency shift. An AOM controlled to act as a frequency shifter operates by propagating acoustic waves in a crystal that is transparent for the radiation of interest. These waves form a kind of moving Bragg grating within the crystal. For the first order radiation diffracted by this moving grating, a frequency shift is equal to the modulation frequency of the AOM.

Attenuating device 366 may be for instance a neutral density filter. Attenuating devices 366 may be placed somewhere else in the path of the reference radiation. The degree of attenuation can be made controllable, for example by a motorized neutral density filter wheel.

Figure 5:
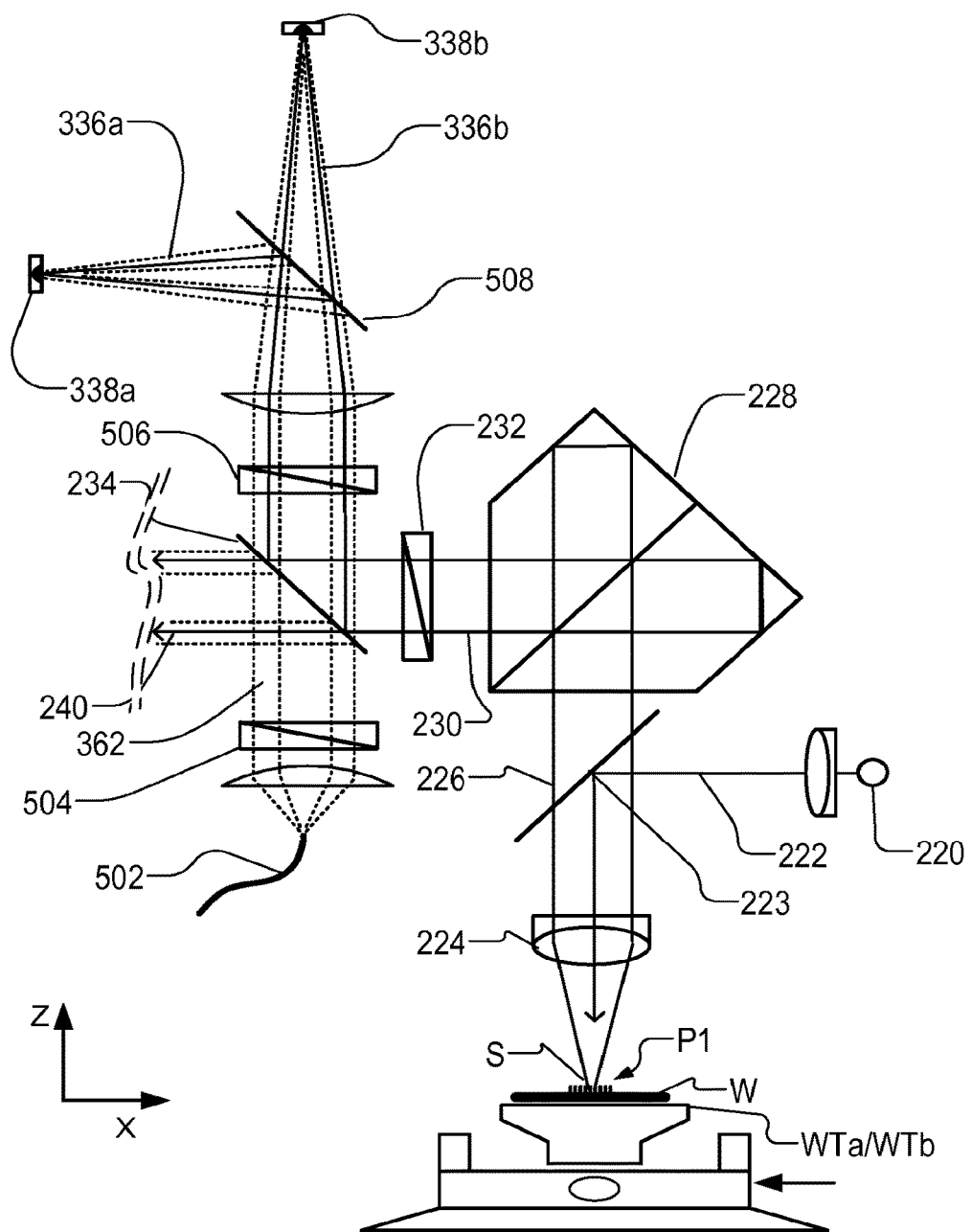
FIG. 5 illustrates schematically an optical system implementing the modifications of the position sensing arrangement of FIG. 2.

FIG. 5 illustrates one possible layout for the optical system 300 of FIG. 3. Many other layouts can be envisaged. Components common to FIG. 2 are given the same reference signs. Thus, for example, information-carrying radiation 226 from the objective lens enters self-referencing interferometer 228. The resulting interference beam 230 passes through half wave plate 232 to a polarizing beam splitter 234, just in the same way that it does in the known position sensing arrangement. Additionally, however, reference radiation 362 is delivered into the existing beam splitter 234, to be combined with the position sensing interference beam 230. Reference radiation 362 may be delivered, for example, by an optical fiber 502 and an additional half wave plate 504. Optical fiber 502 can originate at radiation source 220, so that the position sensing radiation and the reference radiation are coherent. At the output of polarizing beam splitter 234, an additional half wave plate 506 is provided which delivers the interfering radiation to a further polarizing beam splitter 508. The further polarizing beam splitter 508 generates the first and second optical position signals 336a and 336b on the interfering radiation. Note that in this specific embodiment, the reference radiation and signal radiation are collinear, but have orthogonal polarization states between elements 234 and 508. The combination of elements 506 and 508 projects the two orthogonal polarized beams on the same polarization state and also acts as a beam splitter 368, so the signal and reference beams will provide interfering radiation to form the optical position signals 336a and 336b at the photodetectors 338a and 338b.

Accordingly, the combination of elements 504, 234, 506 and 508 implements the functions illustrated in the schematic arrangement shown in FIG. 3, where this combining and splitting was performed in a single beam splitter 368. The skilled reader will be able to envisage numerous other layouts of the required components. The half wave plates 232, 504, 506 perform the function of rotating polarization of radiation, so that it can be split 50%-50% in a polarizing beam splitter. The skilled person will recognize this as conventional technique. Needless to say, in a different type of position sensing arrangement, yet further modifications may be applied, to implement the balanced heterodyne detection technique. Further examples will be illustrated and described below, with reference to FIG. 7 onward.

Further elements may be included in the reference beam path, to match the wavefronts of the reference beam to those of the optical position signals. This is to achieve maximum detection efficiency in balanced detection. Such elements could be, for example, spatial light modulators or MEMS devices, or a 2D array of fibers. Since the grating pattern of the alignment mark is known, the location of the diffraction order or orders in the pupil plane (angular distribution of the position sensing optical signal) is known. The example of FIGS. 9 to 12, described further below, includes a mode matching device for this purpose.

As in the known alignment sensor, a complementary component of position sensing radiation 240 exits beam splitter 234, and can be used in a parallel detection branch, similar to that shown. In the known alignment sensor, these two branches are referred to as the "sum" and "difference" branches, and the "sum" branch can be used to obtain an intensity normalization signal, to improve accuracy of the overall measurement.

Photodetectors 338a and 338b may for example consist of a photodiode device and/or adapted (i.e. lock-in) photodiode devices. Readers skilled in the art will be able to adapt known lock-in methods and/or phase-sensitive detection methods to detect amplitude and phase images as described herein. Using lock-in functionality, amplitude and phase values $(A, \varphi)$ can be calculated and used if desired, not only intensity. The detailed operation of the lock-in functions and heterodyne detection is described in more detail in the references mentioned at the end of the introduction, above.

As mentioned already, multiple signals can be combined in the optical system and separated in the detection system, by applying different phase modulations and detecting different time-varying components. In the known position sensing arrangement of FIG. 2, it is customary to provide a number of different wavelengths and/or broadband radiation, either sequentially or in parallel. When these optical signals are applied in parallel by the known techniques, either time division or spectral filters must be applied to de-multiplex the different signals. Using the heterodyne detection technique, position sensing radiation of different optical wavelengths can be multiplexed and de-multiplexed without any optical filters, without separate photodetectors, and without losing time sequencing between them. This is done by interfering each wavelength with its own reference signal, and applying a different phase modulation to each one.

Figure 6:
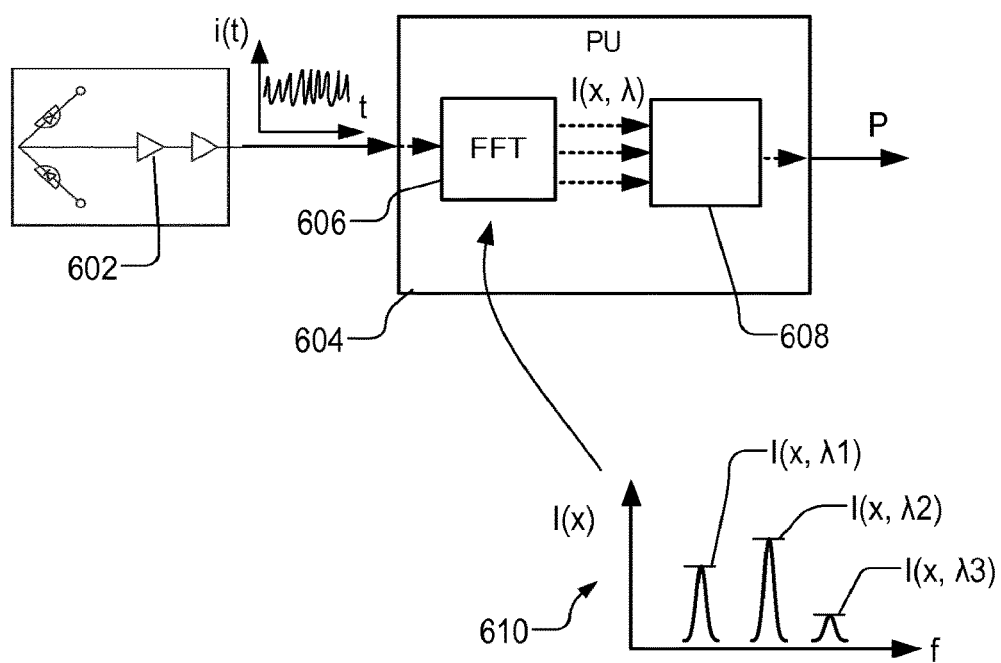
FIG. 6 illustrates an alternative form of electronic signal processing, in an embodiment operating with multiple wavelengths.

FIG. 6 illustrates an alternative embodiment of the electronic signal processing arrangement of FIG. 4. As before, a matched pair of photodetectors are connected in series and a difference current is amplified by one or more preamplifiers 602. A time varying signal i(t) is delivered to a digital signal processor 604. Digital signal processor 604 may comprise dedicated digital signal processing (DSP) circuitry, or a general purpose microprocessor programmed appropriately. Rather than providing individual lock-in detectors, digital signal processor 604 includes a spectral analysis module 606, for example by implementing a Fast Fourier Transform (FFT). As illustrated in the graph 610, module 606 performs a spectral analysis of the time varying signal i(t), and resolves three independent intensity levels having distinct frequency components. Knowing that these frequency components correspond to frequency shifts applied to the reference radiation of three different wavelengths $\lambda 1$, $\lambda 2$, $\lambda 3$, digital signal processor 604 is able to extract three independent position sensing signals $I(x,\lambda 1)$, $I(x,\lambda 2)$, $I(x,\lambda 3)$ from the original time varying signal i(t). Each of these represents an independent measurement of position, benefiting from the optical amplification and noise rejection properties of the balanced heterodyne detection technique.

A position output module 608 receives these three position signals and outputs a single position measurement P. Position output module 608 may combine the three signals in some way, or may simply select a "best" one to be used for this particular alignment task. For example, looking at graph 610 in FIG. 6, it may be judged that wavelength $\lambda 2$ provides the best signal, as the position-dependent signal $I(x,\lambda 2)$ shows the greatest variation with position. At the same time, it may be known that this wavelength is more susceptible to process variations that incorrectly distort position measurements, so that another wavelength should be preferred. The present disclosure is not concerned with how this is done, many ways providing the position-dependent signals themselves.

Figure 7:
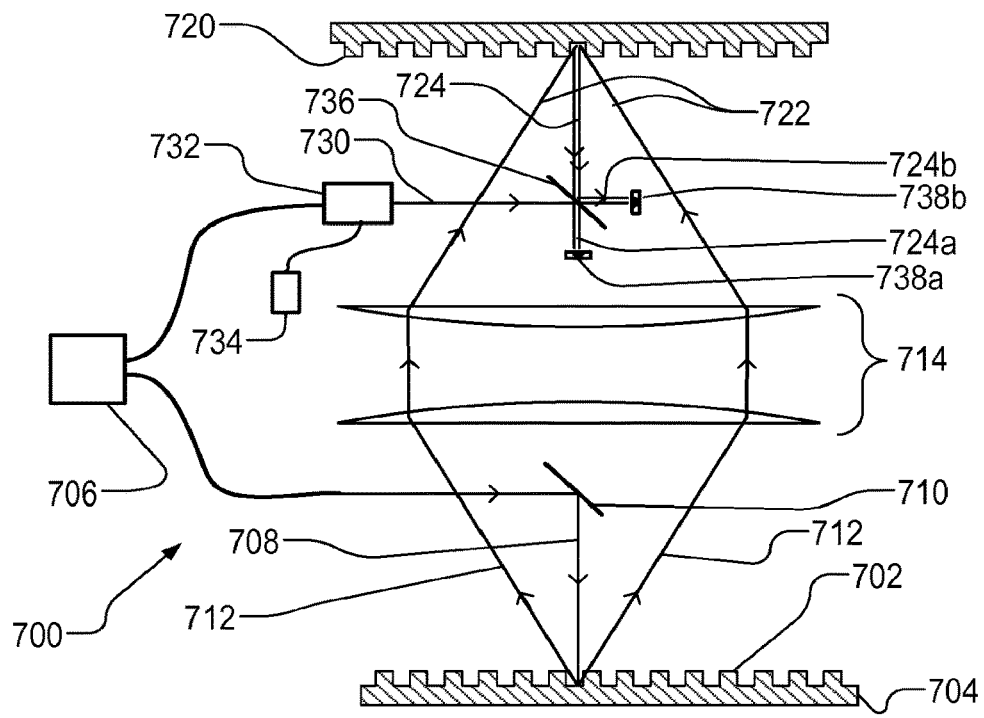
FIG. 7 illustrates schematically the application of balanced heterodyne detection in another embodiment of the present invention.

FIG. 7 illustrates schematically an arrangement for applying the principle of balanced heterodyne detection in a different type of position sensing arrangement. The arrangement 700 in this case is based on the position sensing principles of the ATHENA sensor, which are disclosed in the U.S. Pat. No. 6,297,876B1 (Bornebroek et al). The contents of U.S. Pat. No. 6,297,876B1 which are incorporated herein by reference. An alignment mark 702 having predetermined grating features is provided on a substrate 704. The position sensing arrangement includes a light source 706 which illuminates the alignment mark with on-axis beam of radiation 708 via a spot mirror 710. Diffraction of this radiation by the alignment mark causes off-axis beams 712 of radiation to be generated, which are captured by an optical system 714.

Optical system 714 images the illuminated alignment mark onto a reference grating 720. Provided that the pitch and orientation of the alignment mark matches the pitch and orientation of the reference grating, the reference grating diffracts the off-axis beams 722 so that they are recombined and interfere to provide an optical position sensing signal 724. Where the known alignment sensor would have a single photodetector, the modified position sensing arrangement of FIG. 7 has a balanced heterodyne detection system.

To implement the balanced heterodyne detection technique, as in the example of FIG. 3, a portion of the radiation from radiation source 706 is taken to provide reference radiation 730. A phase modulator 732 applies a phase modulation to the reference radiation 730, relative to the position sensing radiation 708. The phase modulation is controlled by a frequency reference source 734. An attenuating device (not shown) provides for control of the intensity of the reference radiation. Position sensing signal 724 in the modified arrangement is not focused on a single photodetector, but is mixed with the reference radiation 730 in a beam splitter 736.

Because of the applied relative phase modulation, interference between the reference radiation and the position signal radiation results in a pair of optical position signals, labeled 724a and 724b in FIG. 7. Each of these optical position signals carries a time varying component corresponding to time variations in the phase $\theta$ applied by phase modulator 732. The time varying components in the two optical position signals 724a and 724b are exactly in antiphase with one another. The optical position signals are focused onto a matched pair of photodetectors 738a and 738b. By subtracting the signals from the two photodetectors, the time varying component becomes highlighted. Using synchronous detection based on knowledge of the applied phase modulation, the optical position signals can be used to obtain an electronic position signal with improved signal to noise ratio. The synchronous detection can be implemented as described above with reference to FIGS. 4 and 6.

The optical system 714 is shown in a highly simplified form sufficient for explaining the principles of the present disclosure. The optical system 714 in practice may additional elements for separately processing multiple higher order diffracted beams, and for separately processing radiation of different wavelengths. Details of such arrangements can be found in U.S. Pat. No. 6,297,876B1. Additionally, as illustrated in U.S. Pat. No. 6,297,876B1, the reference grating can be transmissive in form, while a reflective reference grating 720 is illustrated in FIG. 7. While a simple reference grating 720 is shown as an example, the off-axis beams can be recombined by a variety of techniques. Alternatives include (programmable) phase and/or amplitude masks, AOMs, free space optics, etc. To allow measurements using different target gratings, the reference grating 720 may be selected from a plurality of available reference gratings. These may differ for example in pitch and or orientation.

Figure 8:
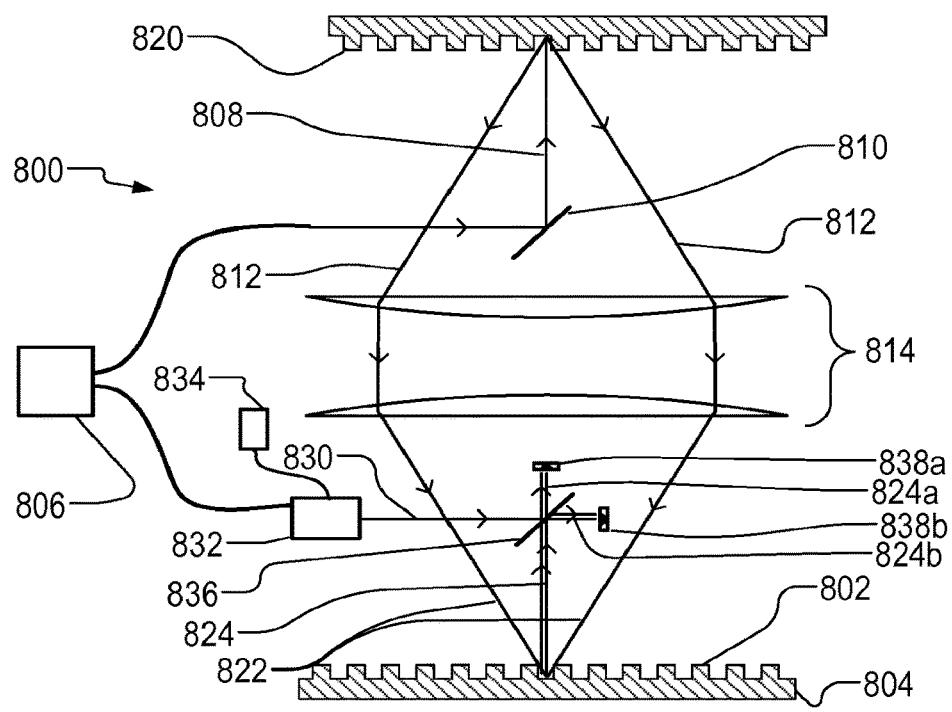
FIG. 8 illustrates schematically the application of balanced heterodyne detection in another embodiment of the present invention.

FIG. 8 shows the balanced heterodyne detection technique applied in a position sensing arrangement 800 of another type. This example implements so-called Laser Interferometric Alignment (LIA), disclosed for example in patent publication U.S. Pat. No. 6,285,455B1 (Shiraishi), the contents of which are incorporated herein by reference. In the particular examples of Shiraishi, the LIA sensor is arranged to operate through the projection lens. The present disclosure applies whether the sensor operates through the projection lens or outside the projection lens.

The LIA position sensing arrangement applies similar principles as the ATHENA sensor of FIG. 7 and the reference signs 802 to 838a/838b in FIG. 8 indicate components having similar functions to the elements 702 to 738a/738b in FIG. 7. Compared with the FIG. 7 sensor, however, the optical path through the components is effectively reversed, as will be seen from the following description. Consequently, the roles of the alignment mark 802 and the reference grating 820 are effectively reversed from their counterparts 702 and 720. The position sensing arrangement includes a light source 806 which illuminates the reference grating 820 with on-axis beam of radiation 808 via a spot mirror 810. Diffraction of this radiation by the reference grating causes off-axis beams 812 of radiation to be generated, which are captured by optical system 814.

Optical system 814 delivers the radiation diffracted by reference grating 820 onto alignment mark 802. Provided that the pitch and orientation of the reference grating matches the pitch and orientation of the alignment mark, the reference grating diffracts the off-axis beams 822 so that they are recombined and interfere to provide a position sensing optical signal 824. Where the known alignment sensor would have a single photodetector, the modified position sensing arrangement of FIG. 8 has a balanced heterodyne detection system.

To implement the balanced heterodyne detection technique, as in the example of FIG. 3, a portion of the radiation from radiation source 806 is taken to provide reference radiation 830. A phase modulator 832 applies a phase modulation to the reference radiation 830, relative to the position sensing radiation 808. The phase modulation is controlled by a frequency reference source 834. An attenuating device (not shown) provides for control of the intensity of the reference radiation. Position signal 824 in the modified arrangement is not focused on a single photodetector, but is mixed with the reference radiation 830 in a beam splitter 836.

Because of the applied relative phase modulation, interference between the reference radiation and the position signal radiation results in a pair of optical position signals, labeled 824a and 824b in FIG. 8. Each of these optical position signals carries a time varying component corresponding to time variations in the phase θ applied by phase modulator 832. The time varying components in the two optical position signals 824a and 824b are exactly in antiphase with one another. The optical position signals are focused onto a matched pair of photodetectors 838a and 838b. By subtracting the signals from the two photodetectors, the time varying component becomes highlighted. Using synchronous detection based on knowledge of the applied phase modulation, the optical position signals can be used to obtain an electronic position signal with improved signal to noise ratio. The synchronous detection can be implemented as described above with reference to FIGS. 4 and 6.

While a simple reference grating 820 is shown as an example, the off-axis beams can be generated by a variety of techniques. Alternatives include (programmable) phase and/or amplitude masks, AOMs, free space optics, etc. To allow measurements using different target gratings, the reference grating 820 may be selected from a plurality of available reference gratings. These may differ for example in pitch and or orientation.

It may be noted that examples of LIA sensors described in the prior art include so-called heterodyne detection, where two diffraction orders that interfere to form the optical position signal are phase modulated so that the optical position signal itself has a characteristic beat frequency. In the present disclosure, by contrast, the balanced heterodyne detection uses phase modulation between the position sensing optical signal 824 and the reference radiation 830. This balanced heterodyne detection technique improves detection of weak position sensing signals, as explained already above.

Figure 9:
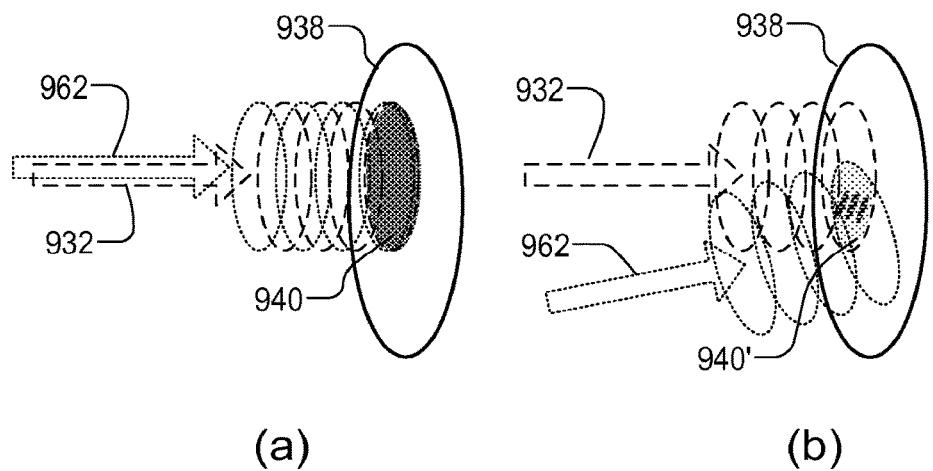
FIG. 9 illustrates the problem of mode matching between a signal beam and a reference beam in the positioning sensing arrangement of FIG. 3.

Referring now to FIG. 9, application of the balanced heterodyne detection technique can be improved by attending to "mode matching", as will now be explained. As illustrated in FIG. 9, the enhanced performance available through balanced heterodyne detection depends on effective interference between an optical position signal 932 (represented in dashed lines) and phase-modulated reference radiation 962 (represented in dotted lines). A detector surface is represented schematically at 938. In the situation shown at (a) the beams and wavefronts overlap very well, providing an interference pattern 940 that does not cancel itself out as it is integrated over the detector surface. In the situation (b), on the other hand, the beams overlap poorly and provide an interference pattern 940' that partially cancels itself out over the detector surface. It may be noted that the optical position signal 932 is itself the product of interference between different diffraction signals, but the present discussion concerns interference between the optical position signal 932 and the phase-modulated reference radiation 962.

In general, two radiation fields with amplitudes $A_1$ and $A_2$ when they interfere on a single-pixel sensor will provide a photo current of the form:

$$I_{sig}=S_D[A_1^2+A_2^2+2M_{1,2}A_1A_2\cos(\Delta_{1,2})]$$

where $S_D$ is a linear factor that includes the conversion of light to photocurrent, $M_{1,2}$ is a mode match efficiency and $\Delta_{1,2}$ is a phase difference between the two radiation fields.

The left term $A_1^2+A_2^2$ in the above equation is the non-interfering term that determines the amount of shot noise. The right term $(2M_{1,2}A_1A_2\cos(\alpha_{1,2}))$ is the interference term that contains the wanted signal. The mode match efficiency can range between 0 and 1. Values approaching 1 indicate "good" interference, meaning that the fields add coherently to each other across the detector surface. Lower values towards 0 indicate that the fields add incoherently to each other and the wanted interference signal is lost. Accordingly, this mode match efficiency should be as high as possible between an optical position signal and a phase modulated reference beam, to get an optimal signal-to-noise-ratio in the balanced heterodyne detection.

In the position sensing arrangements of FIGS. 7 and 8 it is expected that mode match efficiency will be high, because of the matching that is present between the alignment mark 702/802 and the reference grating 720/820. In the position sensing arrangements based on a self-referencing interferometer, however, the examples of FIGS. 3 to 6 have no specific measures to ensure good mode matching, and so sub-optical matching may occur.

Figure 10:
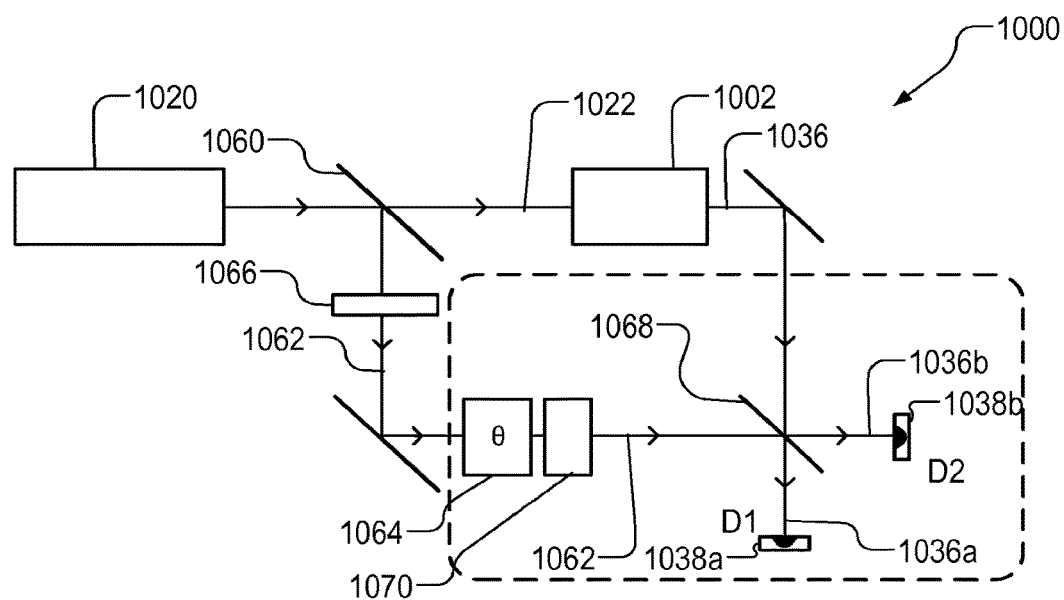
FIG. 10 illustrates schematically optical signal processing in a further modified position sensing arrangement with improved mode matching.

FIG. 10 illustrates schematically optical signal processing in a modified position sensing arrangement 1000, which is the same as the one illustrated in FIG. 3 but includes a mode matching device 1070. Reference signs 1002 to 1068 indicate elements corresponding to elements 302 to 368 in the arrangement of FIG. 3, and their function can be exactly the same as those elements, described above. Mode matching device 1070, as its name implies, conditions the reference radiation 1062 so that it is effectively mode-matched to the optical position signal 1024 before the signals interfere at the detectors 1038a and 1038b.

Figure 11:
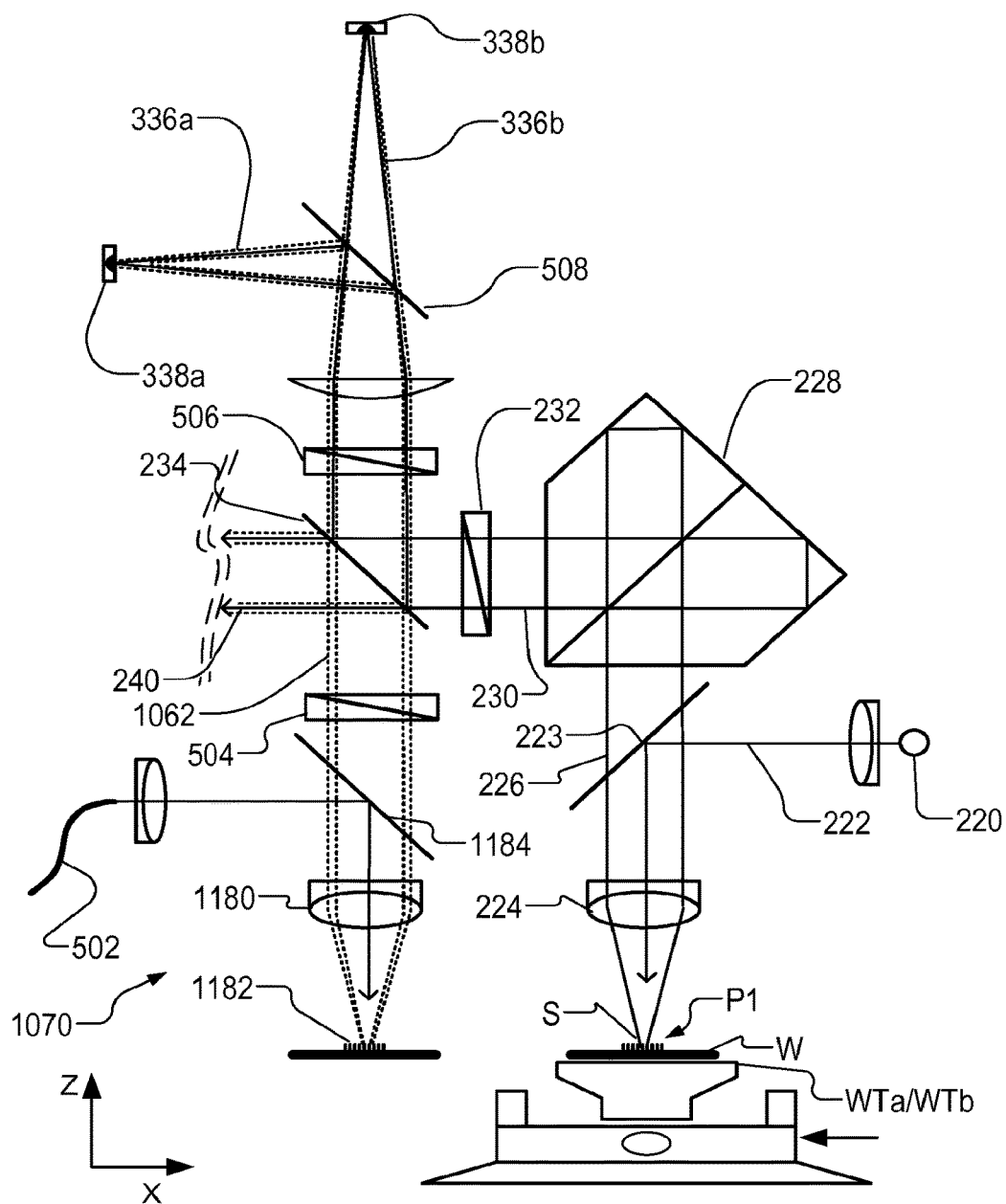
FIG. 11 illustrates schematically an optical system implementing the further modified position sensing arrangement of FIG. 10.

FIG. 11 illustrates one implementation of mode matching device 1070, in the optical system of FIG. 5. The same reference signs are used in FIG. 11 as in FIG. 5, and the functions of those elements can be exactly the same as those elements described above. Mode matching device 1070 comprises an objective lens 1180 matched in performance with objective lens 224 and a reference structure in the form of a fiducial target 1182 which is matched in form with the alignment mark P1. Using a spot mirror 1184, reference radiation 1062 passes from optical fiber 502 through objective lens 1102 to be reflected and diffracted by the fiducial target, returning via the objective lens into the optical system. As in FIG. 5, the reference radiation interferes with optical position signals position sensitive signals in the interference beam 230.

Having been conditioned by the matched objective lens 1180 and the fiducial target 1182, the arrangement of diffraction orders the pupil of the optical system, and their relative phase and intensity, becomes better matched to that of the diffraction orders in the interference signal 230 that carry the position information. Using the matched objective lens 1180 means that optical aberrations are the same in both of the interfering signals. Accordingly, the mode matching value $M_{1,2}$ increases towards 1, and the performance benefits of the balanced heterodyne detection are more fully realized.

A reference structure such as fiducial target 1182 can be easily made of high reflective materials (e.g. aluminum, gold, etc.), minimizing optical losses. It can alternatively consist of real alignment marks formed on substrates in the same way as the alignment mark P1. In addition, the system can be made stable and long lasting. A fiducial target can be designed to support multiple wavelengths.

Figure 12:
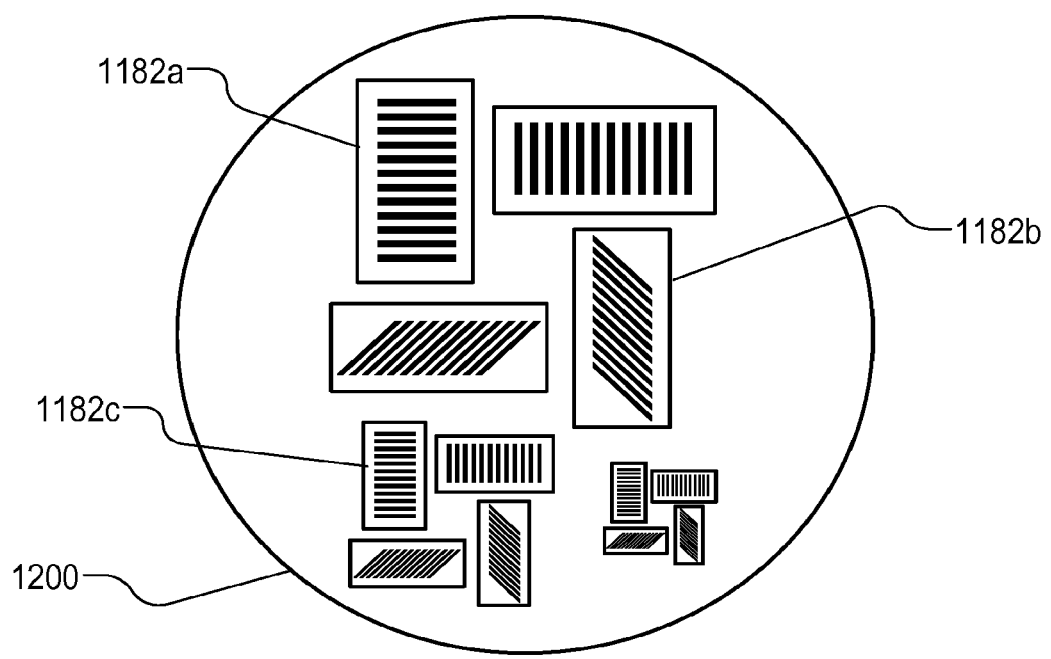
FIG. 12 illustrates a fiducial target assembly in the optical system of FIG. 11.

Referring to FIG. 12 now, it may be envisaged that the arrangement of FIG. 11 is used to measure the positions of several different forms of alignment marks and possibly other targets. For example, there may be different marks for X and Y positioning, and for coarse and fine positioning. In order that fiducial target 1182 can match the form of the mark currently being measured, a fiducial unit 1200 may be provided that has a variety of reference structures such as fiducial targets 1182a, 1182b, 1182c etc., each matched to a particular form of alignment mark. Fiducial unit 1200 may be for example a piece of metal or wafer, which contains many different fiducial targets. The mode matching device 1070 is operated to select the appropriate fiducial grating before measuring. The appropriate fiducial target can be selected by slightly translating and rotating the fiducial unit 1200. After the appropriate grating and orientation have been selected, the arrangement is ready to measure positions of targets having the matching design. In the illustrated example, similar fiducial targets are provided in different orientations, for X and Y position measurements. In an alternative implementation, the same fiducial target could be rotated to different orientations to be used for X and Y position measurements.

As an alternative to providing a variety of fixed fiducial targets, the mode matching device 1070 may include for example a programmable spatial light modulator (SLM). Known types of SLM include a liquid crystal SLM or a micromirror array (DMD). These solutions may not be so effective as a dedicated fiducial target, and attention would need to be paid to some potential error sources. If SLM pixel size does not match the typical pitch dimensions, additional magnification optics is required to compensate for this. Errors may be introduced by the integer nature and grid lay-out of SLM pixels, which might not match exactly the pitch size and grating orientation).

Figure 13:
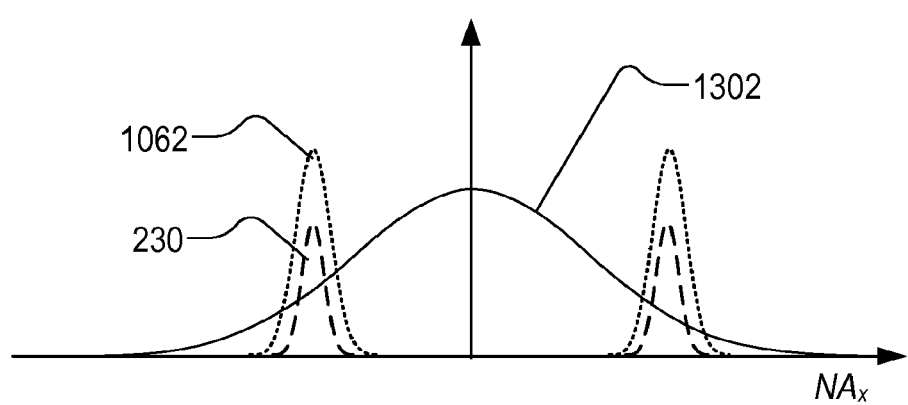
FIG. 13 illustrates a benefit of filtering in the embodiment of FIGS. 10 to 12.

FIG. 13 illustrates another benefit of the balanced heterodyne detection with mode matching, shown in FIG. 11. The graph represents the distribution of radiation intensity across a pupil of the optical system, before it is focused onto the detectors. Radial position $NA_x$ across the pupil is represented along the horizontal axis. As is known, a given position in the pupil of the collection optical system corresponds to a particular angle of radiation reflected, diffracted or scattered by the target. Radiation intensity I is represented along the vertical axis. In a diffraction based alignment sensor, surface scattering will add spurious light intensity 1302 on the detector surface, contributing in additional noise on the alignment signal. The arrangement of FIG. 11 can reduce the noise due to surface scattering in two ways.

The first way is that only the diffracted orders in the interference beam 230 from the alignment mark (dashed lines on the graph) will be amplified. This is because the mode matching provided by the mode matching device 1070 ensures that reference radiation 1062 (dotted lines) is only strong in these same diffraction orders. Scattered radiation 1302 outside these narrow positions (diffraction angles) will not be amplified. Secondly, only a small bandwidth centered on the modulation frequency f is measured by the synchronous detector, further reducing the measured noise.

In conclusion, a benefit of the balanced heterodyne detection technique is the significant increase of the sensitivity of the detection system. This results in an improved signal to noise ratio, because the signal is amplified by means of optical interference, and only noise generated at frequencies around the lock-in frequency can be seen by the lock-in detector. As a direct consequence to the reduction in the noise level, the position measurements become more accurate (and/or allow faster position sensing). Moreover, by being able to select the lock-in frequency, position sensing can be performed using whichever of several wavelengths yields the strongest or most reliable position signals on a given alignment mark. Multiple wavelengths can be applied simultaneously without blending of the wavelengths.

Additionally, an increase in the detection system dynamic range is further achieved by controlling the intensity of the reference radiation delivered by the radiation source via attenuating device 366. A separate attenuating device may be included in the reference radiation for each of multiple wavelengths, where provided.

The balanced heterodyne detection technique can be applied in a variety of known types of position sensing arrangement. In arrangements such as FIGS. 7 and 8, mode matching may be a relatively simple because the matching between reference grating and target means that the optical position signal is a simple beam aligned with the optical axis. In other situations, for example in sensors based on self-referencing interferometers, the distribution of angle and/or phase in the optical position signal may be more complicated. In such sensors, as illustrated above, further measures can be taken to improve mode matching between signal beam and the reference beam. In the example of FIG. 11, this may include matching optical elements and/or fiducial targets. In either case, matching the angular distribution of the reference radiation to the wanted diffraction angles can also improve filtering out of scattered radiation, thereby improving signal to noise ratio in the position signals.

Although specific reference may be made in this disclosure to the use of position sensing arrangements as alignment sensors in lithographic apparatus, it should be understood that the disclosed arrangements may have application in other types of functional apparatuses, as mentioned already above.

The terms "radiation" and "beam" used herein encompass all types of electromagnetic radiation, including infrared radiation, visible radiation, ultraviolet (UV) radiation (e.g. having a wavelength of or about 365, 355, 248, 193, 157 or 126 nm) and extreme ultra-violet (EUV) radiation (e.g. having a wavelength in the range of 5-20 nm). This applies to the alignment sensor as well as to the lithographic apparatus as a whole. A lithographic apparatus may also apply patterns by particle beams, such as ion beams or electron beams.

The term "lens", where the context allows, may refer to any one or combination of various types of focusing or defocusing optical components, including refractive, reflective, magnetic, electromagnetic and electrostatic optical components.

While specific embodiments of the invention have been described above, it will be appreciated that the invention may be practiced otherwise than as described. Furthermore, parts of the apparatus may be implemented in the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A position sensing arrangement comprising:
   an illumination optical system for delivering position sensing radiation to a target;
   a collection optical system for collecting said position sensing radiation after reflection or diffraction from the target; and
   a position signal processing system for receiving the collected position sensing radiation and for processing the collected position sensing radiation to determine a position of the target;
   wherein said position signal processing system further comprises a reference beam delivery system for causing reference radiation to interfere with the collected position sensing radiation, thereby providing interfering radiation,
   wherein a relative phase modulation is applied between the reference radiation and the position sensing radiation so that the interfering radiation includes a time-varying component defined at least in part by the applied phase modulation,
   wherein the position signal processing system includes (i) an optical signal splitting arrangement configured to deliver the interfering radiation to two photodetectors in such a way that each photodetector receives a portion of said interfering radiation, each portion having said time-varying component in anti-phase to the portion received at the other photodetector, and (ii) a detector arranged to receive a difference signal from said two photodetectors and to extract a time-varying component of said difference signal by reference to said applied phase modulation.

2. The arrangement as claimed in claim 1 wherein said two photodetectors are connected in series so as to generate said difference signal prior to any amplification or conversion.

3. The arrangement as claimed in claim 1 wherein said position signal processing system includes a self-referencing interferometer.

4. The arrangement as claimed in claim 3 wherein said reference beam delivery system includes a mode matching device for matching diffraction signals in the reference radiation with diffraction signals of a particular target.

5. The arrangement as claimed in claim 4 wherein said mode matching device includes a reference structure having a form matching that of the target.

6. The arrangement as claimed in claim 5 wherein said mode matching device includes a plurality of reference structures, each of said reference structures being selectable to match different targets.

7. The arrangement as claimed in claim 5 wherein said collection optical system includes an objective lens and said mode matching device further includes an objective lens matching the objective lens of the collection optical system.

8. The arrangement as claimed in claim 1 wherein said position signal processing system includes a reference element arranged to receive off-axis diffraction signals that have been generated by the target and recombine the off-axis diffraction signals into an on-axis optical position signal.

9. The arrangement as claimed in claim 1 wherein said illumination system includes a reference element arranged to generate off-axis diffraction signals that are then recombined by the target into an on-axis position signal.

10. The arrangement as claimed in claim 1 wherein said reference beam delivery system is configured to cause interference with collected radiation only of certain diffracted angles, thereby avoiding interference with a radiation scattered by the target surface at other angles.

11. The arrangement as claimed in claim 1 wherein said position signal processing system is arranged to determine said position using said position sensing radiation collected at multiple positions of the collection optical system relative to the target.

12. The arrangement as claimed in claim 11 wherein the position sensing radiation and the reference radiation include radiation derived from one or more coherent radiation sources.

13. The arrangement as claimed in claim 1 wherein the position sensing radiation comprises first position sensing radiation having a first wavelength range and second position sensing radiation having a second wavelength range, wherein the reference radiation comprises first reference radiation having substantially the first wavelength range and second reference radiation having substantially the second wavelength range, wherein the first reference radiation and first position sensing radiation are provided with a first applied phase modulation and the second reference radiation and second position sensing radiation are provided with a second applied phase modulation so that the interfering radiation detected in the position signal processing system includes a first time-varying component corresponding to the first applied phase modulation and a second time-varying component corresponding to the second applied phase modulation, and wherein the position signal processing system comprises one or more detectors operable with reference to both the first and second applied phase modulations and is operable to select which of the first and/or second position sensing radiation is used to determine said position.

14. The arrangement as claimed claim 1 wherein the reference beam delivery system includes one or more adjustable attenuators for adjustably reducing intensity of the reference radiation.

15. The arrangement as claimed in claim 1 wherein the or each applied phase modulation results in a relative frequency shift between the position sensing radiation and the reference radiation, said time varying component in the interfering radiation comprising a characteristic frequency corresponding to the relative frequency shift.

16. A lithographic apparatus comprising:
an alignment sensor including a position sensing arrangement, the position sensing arrangement including
an illumination optical system for delivering position sensing radiation to a target;
a collection optical system for collecting said position sensing radiation after reflection or diffraction from the target; and
a position signal processing system for receiving the collected position sensing radiation and for processing the collected position sensing radiation to determine a position of the target;
a reference beam delivery system for causing reference radiation to interfere with the collected position sensing radiation, thereby providing interfering radiation, wherein a relative phase modulation is applied between the reference radiation and the position sensing radiation so that the interfering radiation includes a time-varying component defined at least in part by the applied phase modulation,
an optical signal splitting arrangement configured to deliver the interfering radiation to two photodetectors in such a way that each photodetector receives a portion of said interfering radiation, each portion having said time-varying component in anti-phase to the portion received at the other photodetector, and
a detector arranged to receive a difference signal from said two photodetectors and to extract a time-varying component of said difference signal by reference to said applied phase modulation;
the lithographic apparatus further comprising a mechanism for controlling the applying of a pattern to a substrate in response to position measurements made using the position sensing system on targets provided across the substrate.

17. A position sensing method comprising:
(a) delivering position sensing radiation to a target using an illumination optical system;
(b) collecting said position sensing radiation after reflection or diffraction from the target using a collection optical system; and
(c) processing the collected position sensing radiation to determine a position of the target,
wherein the step (c) includes the steps:
(c1) causing reference radiation to interfere with the collected position sensing radiation while applying a relative phase modulation between the reference radiation and the position sensing radiation, to provide interfering radiation that includes a time-varying component defined by the applied phase modulation;
(c2) delivering the interfering radiation to two photodetectors using an optical splitting arrangement in such a way that each photodetector receives a portion of said interfering radiation, each having said time varying component in anti-phase to the portion received at the other photodetector; and
(c3) receiving a difference signal from said two photodetectors and extracting a time-varying component of said difference signal by reference to said applied phase modulation, the extracted time varying component being used in determining the position of the target.

18. A method of manufacturing a device comprising measuring respective positions of a plurality of targets on a substrate, the measuring step comprising
(a) delivering position sensing radiation to a target using an illumination optical system;
(b) collecting said position sensing radiation after reflection or diffraction from the target using a collection optical system; and
(c) processing the collected position sensing radiation to determine a position of the target, wherein the step (c) includes the steps:
(c1) causing reference radiation to interfere with the collected position sensing radiation while applying a relative phase modulation between the reference radiation and the position sensing radiation, to provide interfering radiation that includes a time-varying component defined by the applied phase modulation;
(c2) delivering the interfering radiation to two photodetectors using an optical splitting arrangement in such a way that each photodetector receives a portion of said interfering radiation, each having said time-varying component in anti-phase to the portion received at the other photodetector; and (c3) receiving a difference signal from said two photodetectors and extracting a time-varying component of said difference signal by reference to said applied phase modulation, the extracted time varying component being used in determining the position of the target; and applying of a pattern to the substrate in response using the position measurements.

* * * * *